US008368162B2

(12) United States Patent
Shi et al.

(10) Patent No.: US 8,368,162 B2
(45) Date of Patent: Feb. 5, 2013

(54) LASER POWER CONVERTER FOR DATA DETECTION AND OPTICAL-TO-ELECTRICAL POWER GENERATION

(75) Inventors: Jin-Wei Shi, Taipei (TW); Feng-Ming Kuo, Kaohsiung County (TW)

(73) Assignee: National Central University, Taoyuan (TW)

( * ) Notice: Subject to any disclaimer, the term of this patent is extended or adjusted under 35 U.S.C. 154(b) by 195 days.

(21) Appl. No.: 13/035,015

(22) Filed: Feb. 25, 2011

(65) Prior Publication Data
US 2012/0153417 A1 Jun. 21, 2012

(30) Foreign Application Priority Data
Dec. 16, 2010 (TW) .................................. 99144240

(51) Int. Cl.
*H01L 31/075* (2012.01)
(52) U.S. Cl. ......... 257/458; 257/E31.018; 257/E31.021; 438/59

(58) Field of Classification Search .................. 257/458, 257/E31.018, E31.021; 438/59
See application file for complete search history.

(56) References Cited

U.S. PATENT DOCUMENTS

| 5,436,756 A * | 7/1995 | Knox et al. .................... 359/260 |
| 6,750,072 B2 * | 6/2004 | Buchanan et al. ............... 438/24 |
| 2002/0135036 A1 * | 9/2002 | Terano et al. .................. 257/458 |
| 2004/0258422 A1 * | 12/2004 | Grubb et al. ................... 398/183 |
| 2005/0169640 A1 * | 8/2005 | Grubb et al. ................... 398/183 |
| 2008/0230112 A1 * | 9/2008 | Barnham et al. ............... 136/249 |

\* cited by examiner

*Primary Examiner* — Allan R Wilson
(74) *Attorney, Agent, or Firm* — Jackson IPG PLLC (57) ABSTRACT

The present disclosure provides a high-speed laser power converter (LPC). The LPC is able to be cascaded. The LPC has a high-speed photodiode (PD) performance even operated under a forward bias operational voltage. Thus, the present disclosure can generate power (instead of consume power) during high-speed data transmission in an optical interconnect (OI) system using 850 nano-meters (nm) wavelength vertical cavity surface-emitting laser (VCSEL).

7 Claims, 12 Drawing Sheets

LASER POWER CONVERTER FOR DATA DETECTION AND OPTICAL-TO-ELECTRICAL POWER GENERATION

TECHNICAL FIELD OF THE DISCLOSURE

The present disclosure relates to laser power converter (LPC); more particularly, relates to providing a high-speed cascade-enabled GaAs/AlGaAs-based LPC for 10 Gbit/sec data detection and for achieving a 21.1% efficiency of optical-to-electrical (O-E) direct-current (DC) power generation.

DESCRIPTION OF THE RELATED ARTS

Photodiode (PD) is a device to convert optical signal into electrical signal. Hence, its response speed and quantum efficiency are the keys. For optical interconnect (OI) applications, a high-density vertical cavity surface-emitting laser (VCSEL) array needs cooperation of easily coupled and high-density optical detectors. But, a general optical detector usually needs outside reverse bias (−3~−5V) for high-speed operation, and, so, power is consumed and extra bias circuit is required.

Traditional p-i-n PD has a depletion layer (i.e. the i layer) flipped between a wide bandgap p-type layer and an n-type layer, where an absorption layer is contained in the depletion layer and inlet photons are absorbed in the depletion layer with electron-hole pairs excited out at the same time. The electron-hole pairs are accelerated by the electrical field in the depletion layer to be wiped into the p-type layer and the n-type layer to form a photocurrent. However, because the speed of the holes is far slower than that of electrons and, so, the holes can be easily jammed in intrinsic region. Thus, its inner electrical field may become small and output of carriers also become slow to further affect output power. Therein, although the thickness of the depletion layer may be increased to reduce resistance-capacitance (RC) bandwidth limit, drifting time may become long and response speed may become slow as well. On the contrary, if the thickness of the depletion layer is decreased, drifting time may be shortened and saturation current may be increased, only that electrical capacitance may be increased to reduce bandwidth and thus further reduce quantum efficiency. Moreover, since equivalent mass of hole is heavy, this kind of devices has to be operated with an extra bias more than −3 volts (V) for accelerating transportation of holes. Hence, if a traditional p-i-n PD is operated without extra bias, hole will drift very slow owing to low electrical field in the depletion layer and the speed of the whole device will become slow too. Yet, if bandgap of the depletion layer is increased for increasing the inner electrical field, light absorption efficiency will be greatly reduced.

A uni-traveling-carrier photodiode (UTC-PD) has a p-type narrow bandgap absorption layer and a wide bandgap collector layer. Because the p-type absorption layer is quasi-neutral and carriers are thus rapidly expands to contact metal, electrons are the only working load in the UTC-PD and a transient time of the UTC-PD is decided by a transmission time of the electrons (including time for passing through a transportation layer and the absorption layer). Nowadays, InGaAs/InP-based UTC-PD is widely used in 1550 nm optical communication. However, under 850 nm bandwidth, InP-based PD absorbs a lot of energy and, thus, un-wanted electron-hole pairs will be generated in the collector layer, where the effect of space electric field induced by the holes stayed in the absorption layer will hinder the high-speed performance of the whole device.

Lately, an UTC-PD is used to show a high-speed and good-responsivity performance for data detection under zero bias. Yet, when the UTC-PD is operated under a forward bias, its speed is slowed down and it is thus not suitable for solar energy conversion under high speed and low power consumption since a forward bias is required in the conversion process. Hence, the prior arts do not fulfill all users' requests on actual use.

SUMMARY OF THE DISCLOSURE

The main purpose of the present disclosure is to provide a high-speed cascade-enabled GaAs/AlGaAs-based LPC for high-speed data detection and for achieving a high efficiency of O-E DC power generation.

The second purpose of the present disclosure is to provide a single LPC for achieving 10 Gbit/sec data detection and 21.1% O-E power generation efficiency with 850 nm optical wavelength.

To achieve the above purposes, the present disclosure is an LPC for data detection and O-E power generation, comprising a PD unit, a load resistance and a DC to DC (DC-DC) converter, where the PD unit comprises a PD, a first end and a second end; where the PD is formed on an n-type distributed bragg reflector (n-DBR) and is separated with the n-DBR by a semi-insulation layer set in between; where the PD comprises a plurality of layers and the layers are serially connected and stacked to form an epi-structure having a p-i-n interface; where the layers of the PD comprises an etching stop layer, a buffer layer, an n-type ohmic contact layer, a transport layer, a graded bandgap layer, a setback layer, an absorption layer, a diffusion block layer and a p-type ohmic contact layer; where the etching stop layer is an un-doped first semiconductor located on the semi-insulation layer; where the buffer layer is an un-doped second semiconductor located on the etching stop layer; where the n-type ohmic contact layer is an n-type doped third semiconductor located on the buffer layer and has an n-type metal conductive layer; where the transport layer is an un-doped or n-type graded doped or graded bandgap fourth semiconductor located on the n-type the ohmic contact layer; where the graded bandgap layer is an un-doped fifth semiconductor located on the transport layer; where the setback layer is an un-doped sixth semiconductor located on the graded bandgap layer; where the absorption layer is a p-type doped seventh semiconductor located on the setback layer; where the diffusion block layer is a p-type doped eighth semiconductor located on the absorption layer; where the p-type ohmic contact layer is a p-type doped ninth semiconductor located on the diffusion block layer and has a p-type metal conductive layer; and where the load resistance and the DC-DC converter are coupled between the first end of the PD and the second end of the PD. Accordingly, a novel LPC for data detection and O-E power generation is obtained.

BRIEF DESCRIPTIONS OF THE DRAWINGS

The present disclosure will be better understood from the following detailed description of the preferred embodiment according to the present disclosure, taken in conjunction with the accompanying drawings, in which.

DESCRIPTION OF THE PREFERRED EMBODIMENT

The following description of the preferred embodiment is provided to understand the features and the structures of the present disclosure.

Please refer to FIG. 1 to FIG. 4, which are a structural view showing a preferred embodiment according to the present disclosure; top-down views showing a single LPC and cascaded LPCs; and a sectional view showing a PD. As shown in the figures, the present disclosure is a laser power converter (LPC) 100 for data detection and optical-to-electrical (O-E) power generation, comprising a photodiode (PD) unit 1, a load resistance 2 and a direct-current to direct-current (DC-DC) converter 3.

Figure 1:
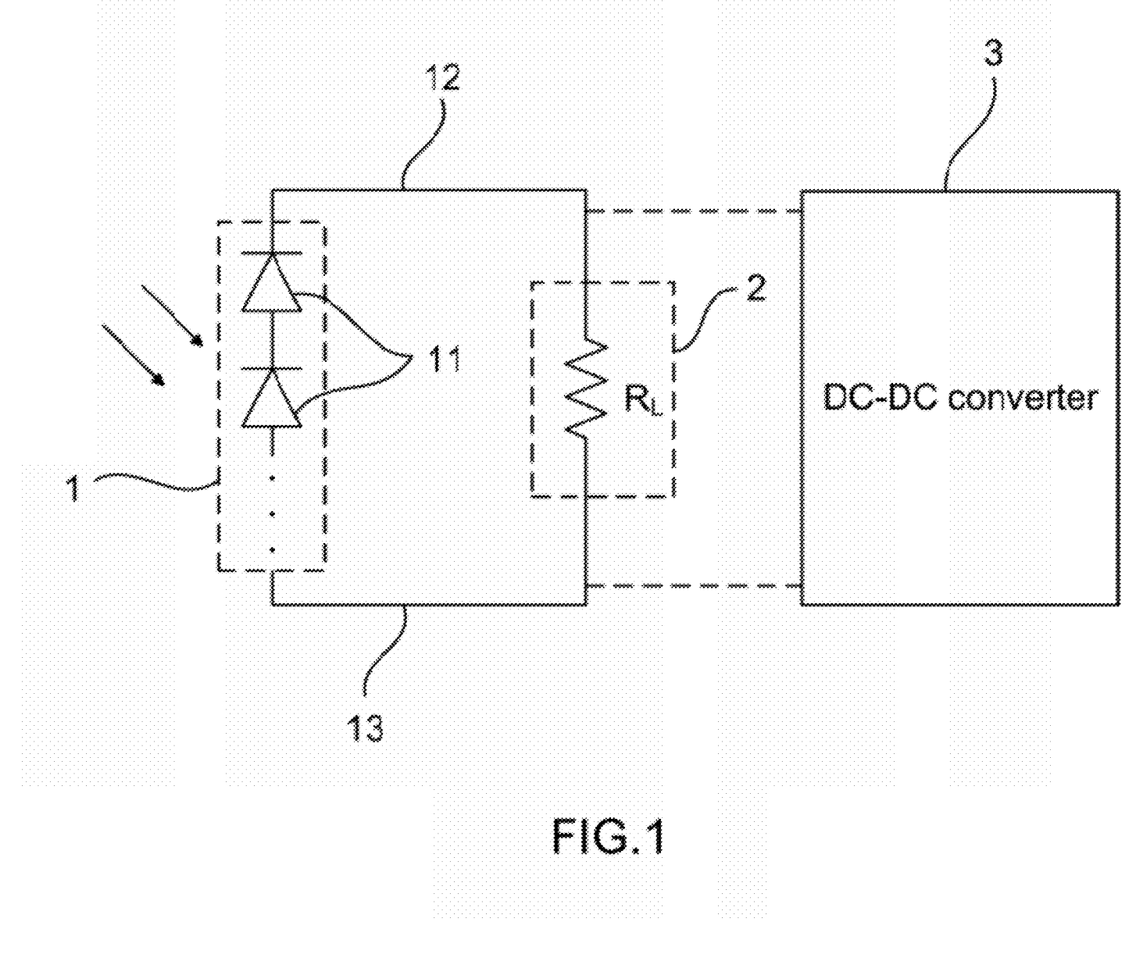
FIG. 1 is the structural view showing the preferred embodiment according to the present disclosure.
Figure 4:
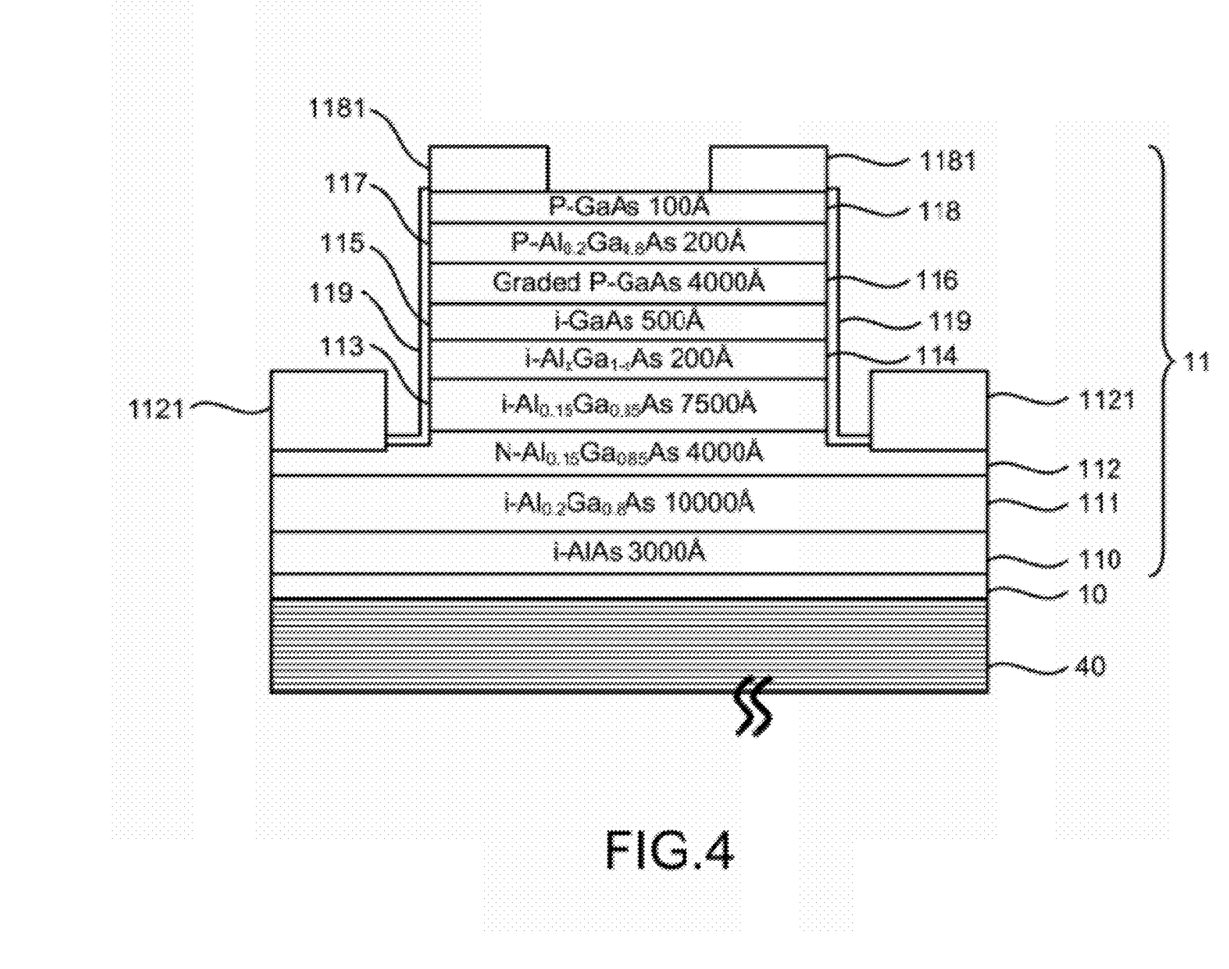
FIG. 4 is the sectional view showing the PD.

The PD unit 1 is a uni-traveling-carrier photodiode (UTC-PD), comprising a PD 11, a first end 12 and a second end 13, where the PD 11 is formed on an n-type distributed bragg reflector (n-DBR) 40 and is separated with the n-DBR 40 by a semi-insulation layer 10 set in between; where the PD 11 comprises an etching stop layer 110, a buffer layer 111, an n-type ohmic contact layer 112, a transport layer 113, a graded bandgap layer 114, a setback layer 115, an absorption layer 116, a diffusion block layer 117 and a p-type ohmic contact layer 118; and where layers of the PD 11 are serially connected and stacked and the PD 11 further has a lateral protection layer 119 to form an epi-structure having a p-i-n interface. The PDs 11 in the PD units 1 can be serially connected. The etching stop layer 110 is an un-doped first semiconductor located on the semi-insulation layer 10 for processing a selective etching; the buffer layer 111 is an un-doped second semiconductor located on the etching stop layer 110 for focusing optical mode in the absorption layer 116; the n-type ohmic contact layer 112 is an n-type doped third semiconductor located on the buffer layer and has an n-type metal conductive layer 1121 for functioning as an n-type electrode; the transport layer 113 is a un-doped or n-type graded doped or graded bandgap fourth semiconductor located on the n-type ohmic contact layer 112 to reduce capacitance; the graded bandgap layer 114 is an un-doped fifth semiconductor located on the transport layer 113 for protecting electronic drift; the setback layer 115 is an un-doped sixth semiconductor located on the graded bandgap layer 114 for preventing p-type doped material from diffusing into un-doped area; the absorption layer 116 is a p-type doped seventh semiconductor located on the setback layer 115 for absorbing inlet light and transforming the light into carrier; the diffusion block layer 117 is a p-type doped eighth semiconductor located on the absorption layer 116 for preventing electron from diffusing back to p-type doped area; and, the p-type ohmic contact layer 118 is a p-type doped ninth semiconductor located on the diffusion block layer 117 and has a p-type metal conductive layer for functioning as a p-type electrode.

The load resistance 2 and the DC-DC converter 3 are coupled between a first end 12 and a second end 13 of the PD 11.

Thus, a novel LPC for data detection and O-E power generation is obtained.

In the PD 11, the etching stop layer 110 is made of un-doped AlAs; the buffer layer 111 is made of un-doped AlGaAs; the n-type ohmic contact layer 112 is made of n-type doped AlGaAs; the transport layer 113 is made of un-doped or graded n-type doped or graded bandgap AlGaAs or InGaP or InP or InAlGaAs; the graded bandgap layer 114 is made of un-doped AlGaAs or InAlGaAs; the setback layer 115 is made of un-doped GaAs; the absorption layer 116 is made of p-type doped GaAs or GaAsSb; the diffusion block layer 117 is made of p-type doped AlGaAs; and, the p-type ohmic contact layer 118 is made of p-type doped GaAs.

Preferably, the transport layer 113 is made of graded bandgap $In_xAl_yGa_{0.48-y}As$, where x is 0.52 and y is a value between 0.2 and 0.48, and the absorption layer 116 is made of p-type doped $GaAs_{0.51}Sb_{0.49}$.

In FIG. 4, the LPC 100 having a wavelength of 850 nanometers (nm) has a 400 nm-thick p-type GaAs-based absorption layer 116 and a 750 nm-thick un-doped $Al_{0.15}Ga_{0.85}As$-based transport layer 113, where the absorption layer 116 has a p-type graded doped structure ($1\times10^{19}$ cm$^{-3}$~$1\times10^{17}$ cm$^{-3}$) for accelerating photoelectron diffusion. Because UTC is an active carrier, the PD 11 has a faster drift speed than a general p-i-n PD under a small electric field (~10 kV/cm). Hence, a high-speed operation is obtained with a forward bias. Besides, because conduction band of the interface between the transport layer 113 and the absorption layer 116 is discontinuous, a 20 nm-thick n-type doped graded bandgap layer 114 is inserted in between for reducing a current blocking effect under the operation with a forward bias. As shown in FIG. 4, the whole structure of the LPC 100 is grown on the n-type DBR 40 for improving an optical responsivity.

Figure 3:
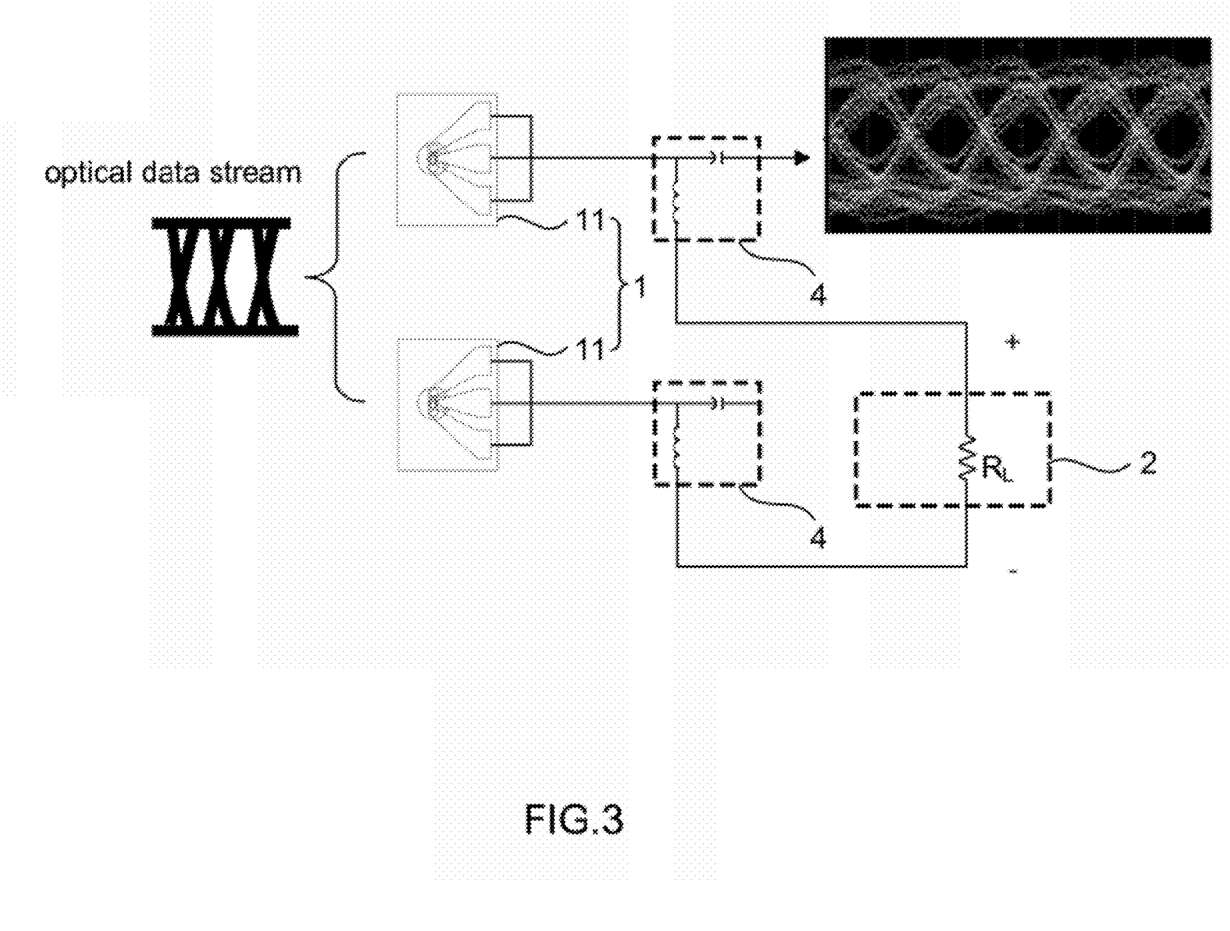
FIG. 3 is the top-down view showing the cascaded LPCs.

Output voltage of photovoltaic LPC is usually too low to supply power to other active devices of an optical interconnect (OI) system. Hence, LPCs 100 of the present disclosure are serially connected by connecting PDs 11 for increasing working voltage of the LPCs 100. Furthermore, because interface capacitance of LPC is reduced after the serial connection, LPC's performance is obviously enhanced. In FIG. 3, two bias tees 4 are used in the present disclosure to connect DC portion of two LPCs (ie. two PDs 11) and radio-frequency (RF) signals are outputted from one of the LPCs.

Figure 2:
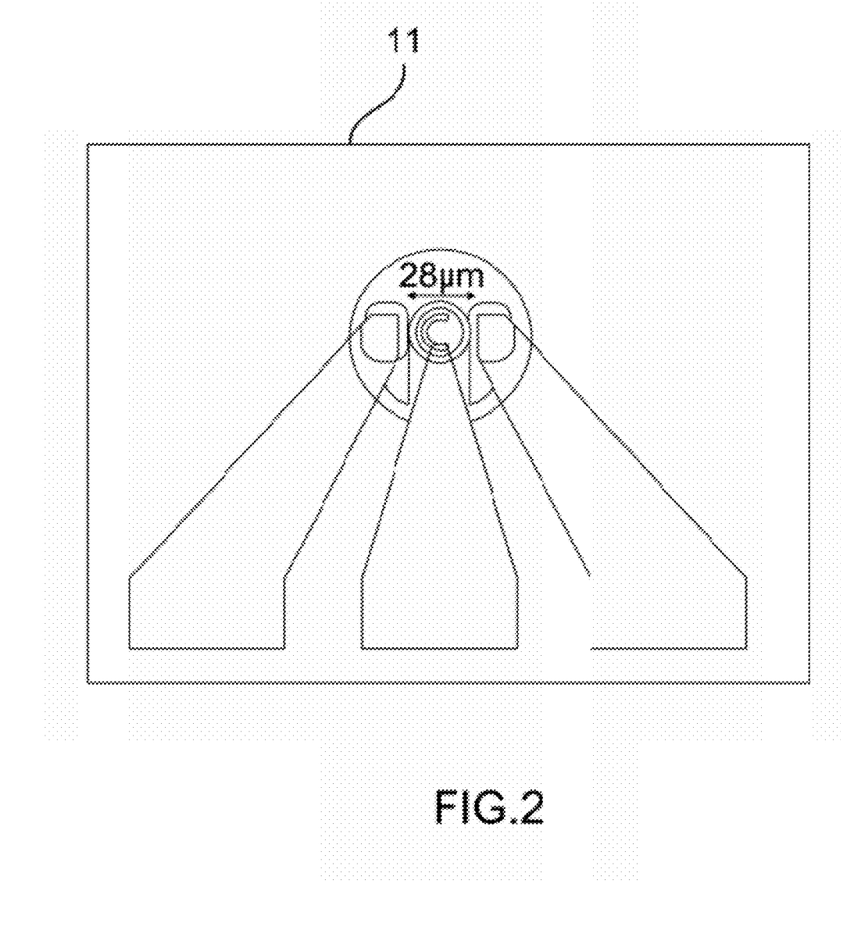
FIG. 2 is the top-down view showing the single LPC.

On using the present disclosure, the LPC 100 is connected with an active circular plate and a p-type ring through a typical vertical illuminated PD. The plate and the ring have diameters of 28 micrometers (μm) and 20 μm for illuminance, respectively. In FIG. 2, the LPC is a high-speed GaAs/AlGaAs-based LPC, where a number of the LPCs can be serially connected. Under a 850 nm wavelength and a +1 V operational voltage, 10 Gbit/sec error-free data detection and 21.1% O-E DC power generation efficiency are both achieved.

Please refer to FIG. 5A to FIG. 5D, which are views showing I-V curves of a single LPC and cascaded LPCs; and views showing O-E curves of the single LPC and the cascaded LPCs. As shown in the figures, an LPC has a DC responsivity of 0.41 A/W under zero bias, which is about 60% of external quantum efficiency (EQE). When a working voltage reaches +0.9V, the value is slightly reduced to 0.36 A/W. The present disclosure uses a lightwave component analyzer (LCA) to detect a frequency response of a scattering parameter (S) for obtaining dynamic characteristics of the present disclosure under continuous waves (CW). Therein, the present disclosure uses a tunable semiconductor laser operated under 830 nm as a light source for emitting optical signals into a preferred embodiment through a lens fiber having a 2.5 μm spot diameter.

Figure 5A:
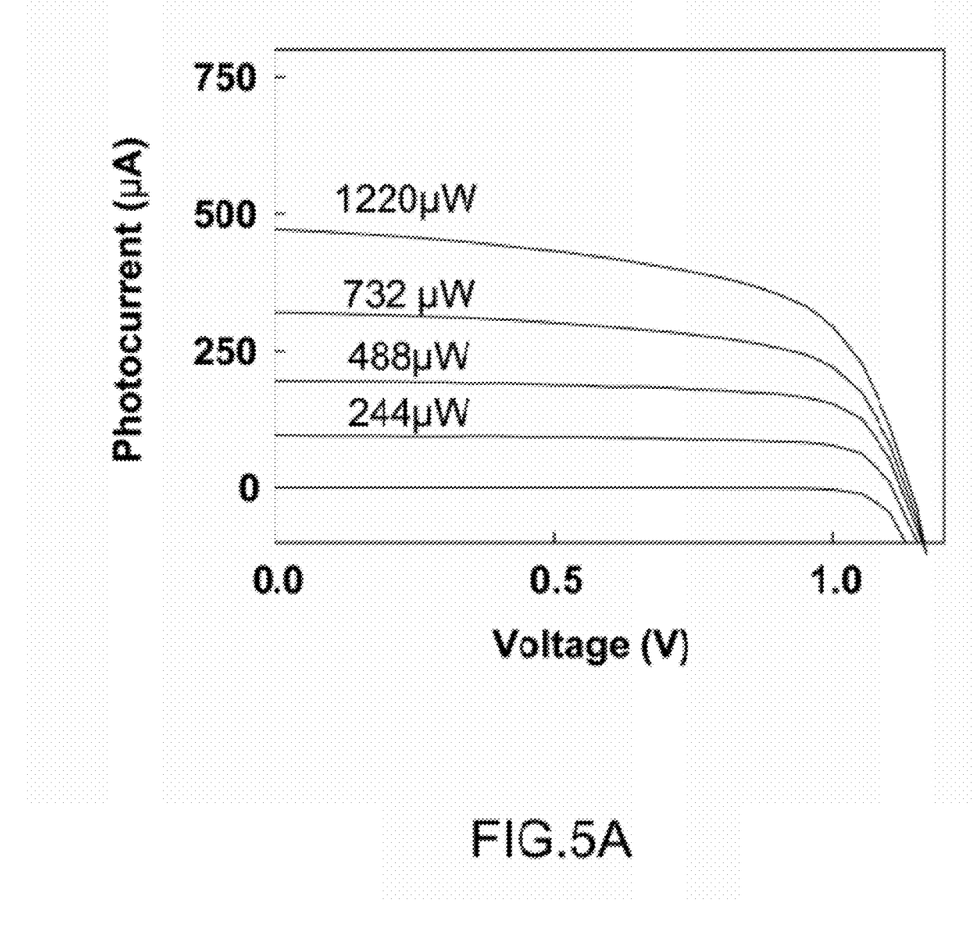
FIG. 5A is the view showing the I-V curves of the single LPC.
Figure 5B:
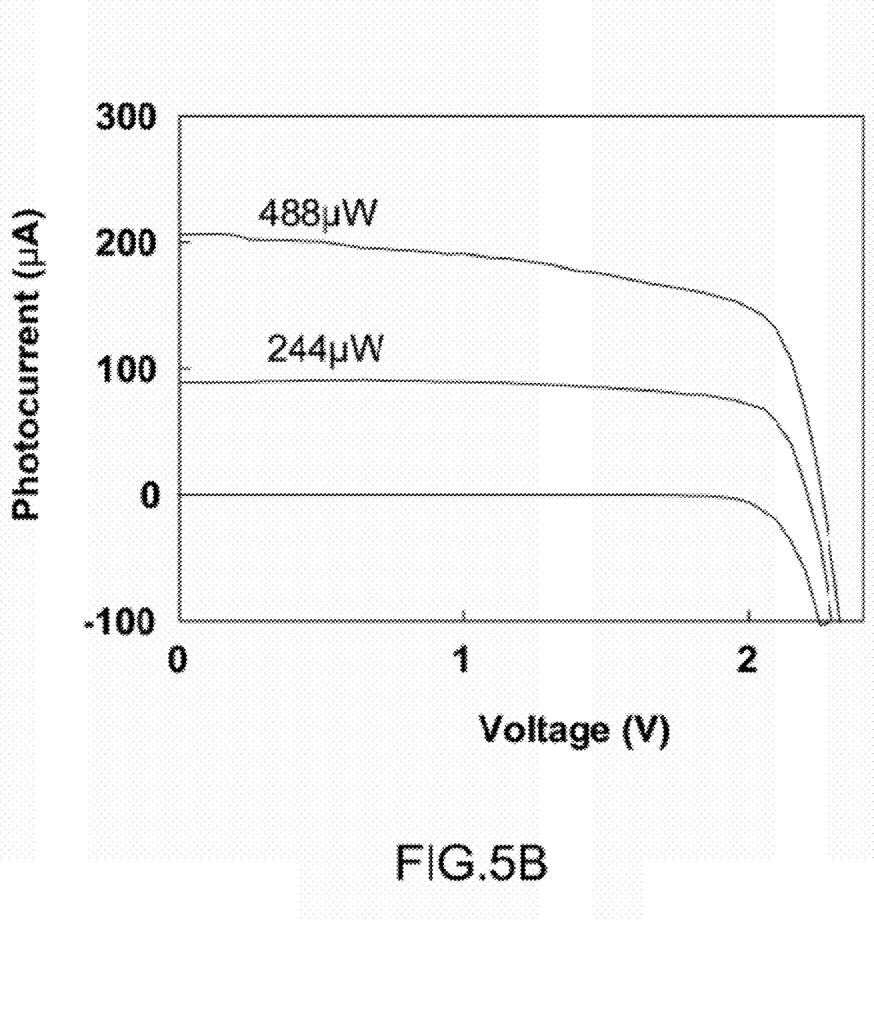
FIG. 5B is the view showing the I-V curves of the cascaded LPCs.

In FIG. 5A and FIG. 5B, through different excitation energies under different output photocurrents, current-to-voltage (I-V) curves of the single LPC and the cascaded LPCs are obtained, where the cascaded LPCs shows a double working voltage and a half responsivity to those of the single LPC.

Figure 5C:
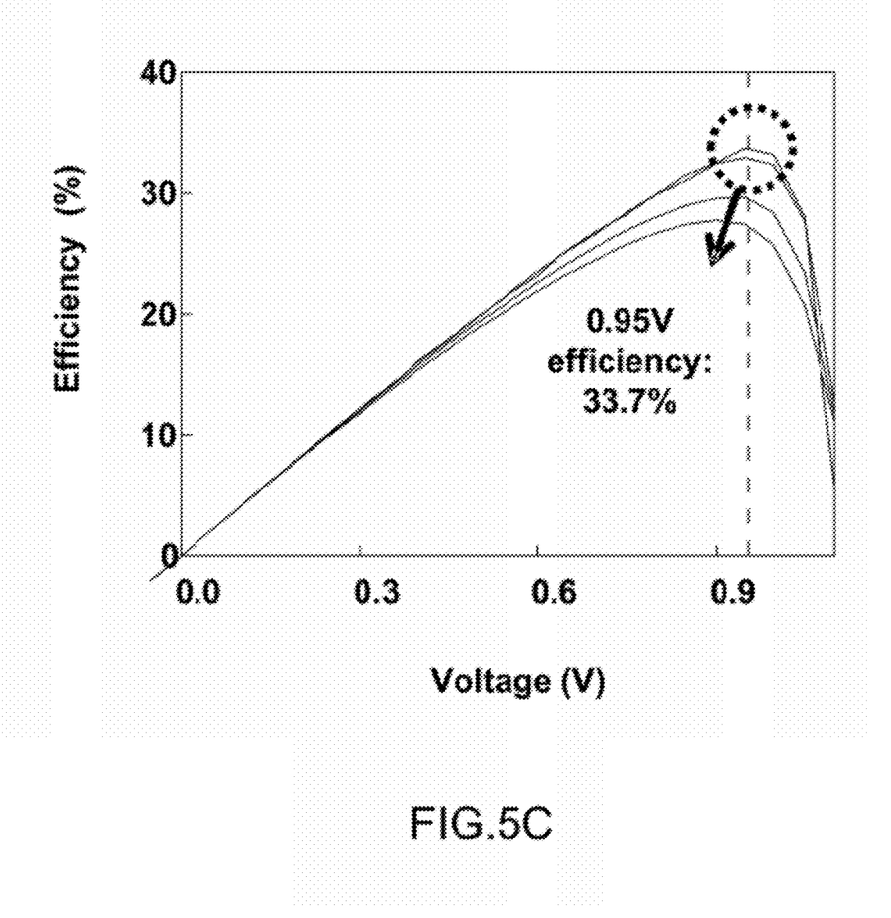
FIG. 5C is the view showing the O-E curves of the single LPC.
Figure 5D:
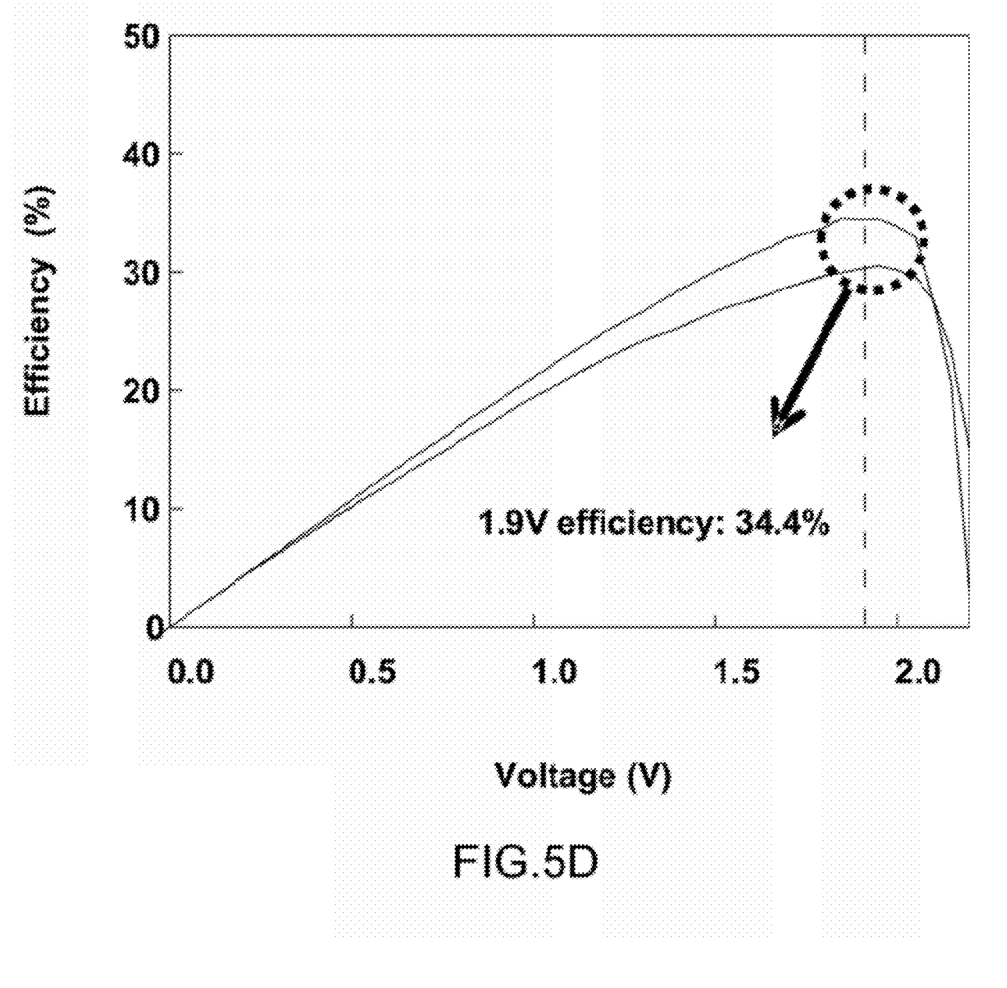
FIG. 5D is the view showing the O-E curves of the cascaded LPCs.

In FIG. 5C and FIG. 5D, under different optical excitation energies, O-E energy conversion efficiencies of the single LPC and the cascaded LPCs are measured under a bias, where both of the biggest O-E energy conversion efficiencies of the single LPC and the cascaded LPCs are about 34% under a low excitation energy and a best bias.

Hence, as shown in FIG. 5A to FIG. 5D, by using either the single LPC or the cascaded LPCs, the present disclosure obtains a good performance on O-E energy conversion efficiency, where the cascaded LPCs are especially good at increasing voltage for further providing high output voltage.

Figure 6A:
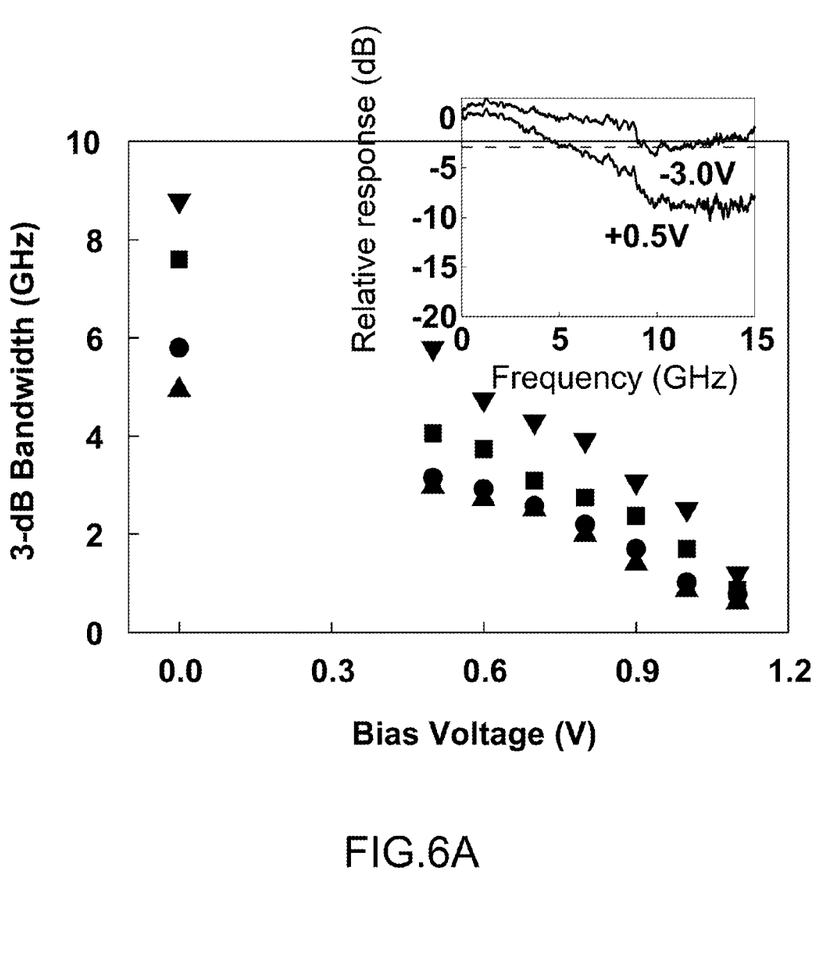
FIG. 6A is the view showing the 3 dB O-E bandwidth and the forward bias of the single LPC.
Figure 6B:
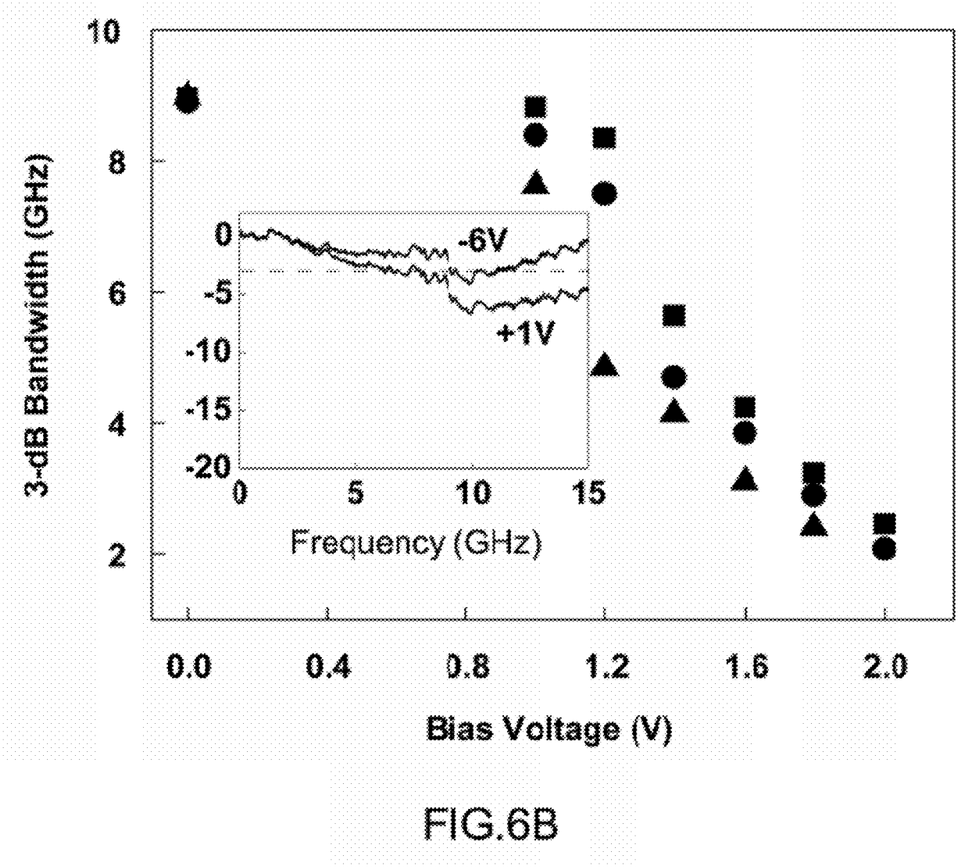
FIG. 6B is the view showing the 3 dB O-E bandwidth and the forward bias of the cascaded LPCs.

Please refer to FIG. 6A and FIG. 6B, which are views showing 3 dB O-E bandwidths and forward biases of a single LPC and cascaded LPCs. As shown in the figures, 3 dB O-E bandwidths and forward biases of a single LPC and cascaded LPCs are measured under different output photocurrents, where O-E frequency responses of the single LPC and cascaded LPCs are also measured under equivalent forward biases (0.5V and +1V, half of turn-on voltage) and reverse biases (−3V and −6V). When both of the forward bias (0V~+2V) and the output photocurrent (50 μA~0.5 mA) are increased, bandwidth is decreased. It is because of a big space charge screening effect owing to the photocurrent when a very small electrical field is in the LPC. Besides, the cascaded LPCs has a faster velocity than the single LPC under an equivalent bias. Under 50 microamperes (μA) bias, the cascaded LPCs operated under +1V bias and the single LPC operated under +0.5V bias have 9 GHz and 6 GHz for 3 dB bandwidth, respectively. Even when the output photocurrent of the cascaded LPCs reaches 0.2 mA, 3 dB bandwidth of the cascaded LPCs remains 7.6 GHz, which shows a good data transmission performance at 10 Gbit/sec under +1V bias.

Figure 7A:
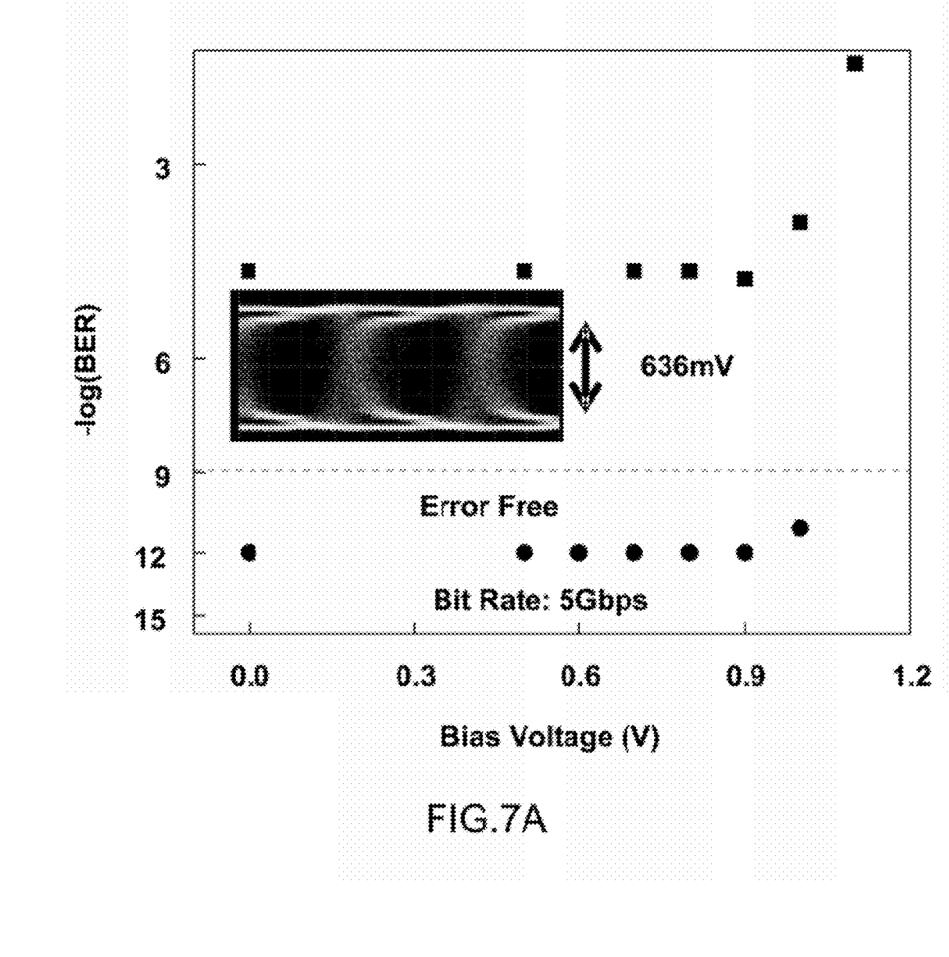
FIG. 7A is the view showing the BER and the forward bias of the single LPC under 5 Gbit/sec.
Figure 7B:
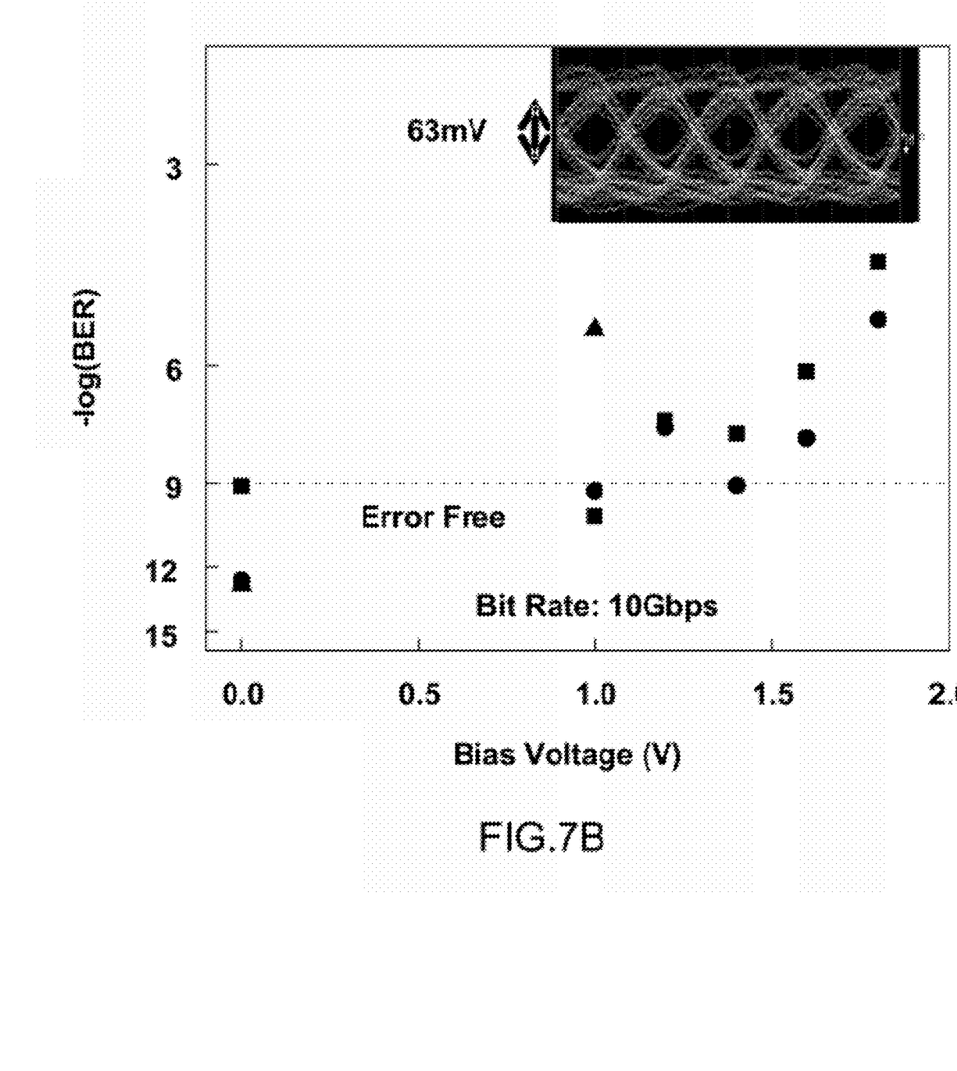
FIG. 7B is the view showing the BER and the forward bias of the cascaded LPCs under 10 Gbit/sec.

Please refer to FIG. 7A and FIG. 7B, which are views showing BERs and forward biases of a single LPC under 5 Gbit/sec and cascaded LPCs under 10 Gbit/sec. As shown in the figures, under different photocurrents, BERs and forward biases of a single LPC under 5 Gbit/sec and cascaded LPCs under 10 Gbit/sec are measured, where eye-patterns for 5 Gbit/sec and 10 Gbit/sec are also shown. The single LPC performs 5 Gbit/sec error-free data transference (BER<$10^{-9}$) with about 0.2 mA output photocurrent and about 34% corresponding O-E energy conversion efficiency. In the other hand, through the cascaded structure, the error-free data transference can be increased to 10 Gibt/sec with O-E energy conversion efficiency increased from 34% to 21.1% under the same operational voltage (+1V) and the same output photocurrent (0.2 mA).

Thus, the cascaded LPCs of the present disclosure has a high speed and a high responsivity with DC current generated under an operation using forward bias, where 10 Gbit/sec error-free data detection and 21.1% O-E power generation efficiency are achieved under +1 V forward bias with 850 nm optical wavelength. The present disclosure provides a high-speed GaAs/AlGaAs-based LPC, which can be cascaded and has a high-speed PD even with am operational valtage of forward bias. Hence, the present disclosure can generate power (in stead of consume power) during high-speed data transmission in an OI system.

To sum up, the present disclosure is an LPC for data detection and O-E power generation, where a high-speed cascade-enabled GaAs/AlGaAs-based LPC achieves 10 Gbit/sec data detection and 21.1% O-E DC power generation efficiency under +1 V forward bias with a 850 nm wavelength.

The preferred embodiment herein disclosed is not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A laser power converter (LPC) for data detection and optical-to-electrical (O-E) power generation, comprising:
   a photodiode (PD) unit,
      wherein said PD unit comprises a PD, a first end and a second end;
      wherein said PD is obtained on an n-type distributed bragg reflector (n-DBR) and is separated with said n-DBR by a semi-insulation layer between said PD and said n-DBR;
      wherein said PD comprises a plurality of layers and said layers are serially connected and stacked to obtain an epi-structure having a p-i-n interface;
      wherein said layers of said PD comprises
         an etching stop layer, said etching stop layer being an un-doped first semiconductor located on said semi-insulation layer;
         a buffer layer, said buffer layer being an un-doped second semiconductor located on said etching stop layer;
         an n-type ohmic contact layer, said n-type ohmic contact layer being an n-type doped third semiconductor located on said buffer layer, said n-type ohmic contact layer having an n-type metal conductive layer;
         a transport layer, said transport layer being a fourth semiconductor located on said n-type said ohmic contact layer, said transport layer being selected from a group consisting of an un-doped semiconductor, an n-type graded doped semiconductor and a graded bandgap semiconductor;
         a graded bandgap layer, said graded bandgap layer being an un-doped fifth semiconductor located on said transport layer;
         a setback layer, said setback layer being an un-doped sixth semiconductor located on said graded bandgap layer;
         an absorption layer, said absorption layer being a p-type doped seventh semiconductor located on said setback layer;
         a diffusion block layer, said diffusion block layer being a p-type doped eighth semiconductor located on said absorption layer; and
         a p-type ohmic contact layer, said p-type ohmic contact layer being a p-type doped ninth semiconductor located on said diffusion block layer, said p-type ohmic contact layer having a p-type metal conductive layer;
   a load resistance,
      wherein said load resistance is coupled between said first end of said PD and said second end of said PD; and a direct-current to direct-current converter (DC-DC converter),
wherein said DC-DC converter is coupled between said first end of said PD and said second end of said PD.

2. The LPC according to claim 1,
wherein said PDs of said LPCs are serially connected.

3. The LPC according to claim 1,
wherein said PD is a uni-traveling-carrier photodiode (UTC-PD).

4. The LPC according to claim 1,
wherein said PD further comprises a lateral protection layer.

5. The LPC according to claim 1,
wherein said etching stop layer is made of un-doped AlAs;
wherein said buffer layer is made of un-doped AlGaAs;
wherein said n-type ohmic contact layer is made of n-type doped AlGaAs;
wherein said transport layer is made of a semiconductor of a doped type, said semiconductor is selected from a group consisting of AlGaAs, InGaP, InP and InAlGaAs, and said doped type is selected from a group consisting of an un-doped type, a graded n-type doped type and a graded bandgap type;
wherein said graded bandgap layer is made of an un-doped semiconductor and said semiconductor is selected from a group consisting of AlGaAs and InAlGaAs;
wherein said setback layer is made of un-doped GaAs;
wherein said absorption layer is made of a p-type doped semiconductor and said semiconductor is selected from a group consisting of GaAs and GaAsSb;
wherein said diffusion block layer is made of p-type doped AlGaAs; and
wherein said p-type ohmic contact layer is made of p-type doped GaAs.

6. The LPC according to claim 1,
wherein said transport layer is made of graded bandgap $In_xAl_yGa_{0.48-y}As$ and x is 0.52 and y is a value between 0.2 and 0.48.

7. The LPC according to claim 1,
wherein said absorption layer is made of p-type doped $GaAs_{0.51}Sb_{0.49}$.

* * * * *